United States Patent [19]

Doscher-Good

[11] Patent Number: 5,204,026
[45] Date of Patent: Apr. 20, 1993

[54] SOLVENT WITH ALICYCLIC CARBONATE AND ETHYLENE DIPROPIONATE

[75] Inventor: Patrisha A. Doscher-Good, Kent, Wash.

[73] Assignee: The Boeing Company, Seattle, Wash.

[21] Appl. No.: 823,937

[22] Filed: Jan. 23, 1992

Related U.S. Application Data

[63] Continuation-in-part of Ser. No. 605,630, Oct. 30, 1990, Pat. No. 5,098,594, which is a continuation-in-part of Ser. No. 354,529, May 19, 1989, abandoned, which is a continuation-in-part of Ser. No. 196,903, May 20, 1988, Pat. No. 5,007,969.

[51] Int. Cl.$^5$ .............. C11D 7/26; C11D 7/32; C11D 7/50; C23G 5/036
[52] U.S. Cl. ..................... 252/542; 134/31; 134/38; 134/40; 252/153; 252/170; 252/171; 252/173; 252/548; 252/DIG. 8
[58] Field of Search ............... 252/153, 162, 170, 171, 252/542, 548, DIG. 8; 134/38, 40

[56] References Cited

U.S. PATENT DOCUMENTS

| | | | |
|---|---|---|---|
| 3,933,517 | 1/1976 | Vivian | 106/311 |
| 3,933,518 | 1/1976 | Vivian | 106/311 |
| 5,007,969 | 4/1991 | Doscher | 134/38 |
| 5,080,831 | 1/1992 | Van Eenam | 252/558 |
| 5,098,594 | 3/1992 | Doscher | 252/162 |

FOREIGN PATENT DOCUMENTS

89/11526 11/1989 World Int. Prop. O.

*Primary Examiner*—Dennis Albrecht
*Attorney, Agent, or Firm*—John C. Hammar

[57] ABSTRACT

A cleaning solvent having an extended shelf life includes ethylene dipropionate, and at least one alicyclic carbonate, preferably propylene carbonate, with or without other additives. Typically additives include triethanolamine (TEA) and N-methyl-2-pyrrolidone (NMP). The solvents may be diluted with water for cleaning tasks where control of corrosion is not an important consideration.

9 Claims, No Drawings

SOLVENT WITH ALICYCLIC CARBONATE AND ETHYLENE DIPROPIONATE

REFERENCE TO RELATED APPLICATIONS

This application is a continuation-in-part application based upon U.S. patent application 07/605,630, filed Oct. 30, 1990, now U.S. Pat. No. 5,098,594, which was a continuation-in-part application based upon U.S. patent application 07/354,529, filed May 19, 1989, now abandoned which is a continuation-in-part based upon U.S. patent application 07/196,903, filed May 20, 1988, now U.S. Pat. No. 5,007,969, issued Apr. 16, 1991.

TECHNICAL FIELD

The present invention relates to liquid organic solvents to replace MEK and other hazardous solvents presently in widespread use.

BACKGROUND OF THE INVENTION

Solvent cleaning is generally accomplished today using a variety of highly or moderately toxic or corrosive solvents. Because of the growing concerns for personal safety and health and for the environment, federal and state governments are promulgating increasingly stringent compliance criteria for solvent manufacturers and users to ensure the health and safety of those working with and around such solvents and to ensure environmentally-sound disposal of wastes that are created. For instance, California limits the use of volatile solvents for some cleaning operations by requiring that they have a vapor pressure below about 1.0 mm Hg at 20° C. For many users, because the wastes are hazardous disposal generally translates into significantly increased costs that are not reflected in the initial material cost for the solvent.

Although personal safety can be promoted Primarily by preventing direct contact and exposure to hazardous solvents or by limiting exposure below published thresholds, such precautions do not account for accidents or individual sensitivities. The flammability, volatility, cleaning ability, stability during storage, and odor are other factors that the user must also consider in choosing a particular solvent.

One solvent that has found widespread application in industrial applications is methylethylketone (MEK). Although MEK is generally considered a satisfactory solvent from a cleaning effectiveness standpoint, there is a growing concern that the toxicity and flammability of MEK exposes users to unnecessary risks. Its volatility raises environmental concerns, especially in areas where photochemical smog is a Problem. Moreover, the expense associated with the sage disposal of MEK wastes is often about 5 to 10 times the material cost for MEK, thereby making MEK an expensive solvent to use.

Increasing efforts are being devoted to developing low toxicity solvents that exhibit low flammability, low volatility, and superior cleaning ability over a wide range of debris; having a pleasant odor or are odorless; are stable during storage; and are readily disposable or recoverable. Such solvents will be safe to use not only in large scale industrial applications, but also on the much smaller scale encountered in every day household cleaning chores.

In U.S. Pat. No. 5,007,969 and U.S. patent application 07/354,529, I described solvents that preferably included a mixture of ethylene carbonate and ethylene diacetate as an important active component of the final solvent mixture. I have now discovered that better solvents can be prepared substituting ethylene dipropionate for the ethylene diacetate. Shelf life of the resulting mixture is enhanced. General utility and handling are further enhanced by substituting propylene carbonate for the ethylene carbonate.

SUMMARY OF THE INVENTION

The solvent of the present invention generally includes a mixture of an alicyclic carbonate (particularly ethylene carbonate, propylene carbonate, or a mixture of ethylene carbonate and propylene carbonate) and a polar compound having at least one strongly electronegative oxygen and selected from the group consisting of alkyl diethers, alkyl diesters, alkyl compounds containing both ester and ether groups, and mixtures thereof, and, particularly, ethylene dipropionate. Normally a solid at room temperature, ethylene carbonate dissolves in the polar compound and remains stable to temperatures far below its normal freezing point.

The solvent of the present invention can be combined with other additives to form further improved solvents. Such additives can be used to reduce the surface tension of the solvent; to increase its ability to clean greases, oils or other residues; or to reduce its aggressiveness for acrylics or other solvent-sensitive plastics. Preferred additives include triethanolamine (TEA) or N-methyl-2-pyrrolidone (NMP). I have discovered that TEA can affect the stability of a mixture including ethylene diacetate apparently by activating the $\alpha$-hydrogens on the acetate to react with alcohols in a chain-addition reaction. Ethylene dipropionate is not susceptible to this breakdown. An ethylene carbonate/ethylene diacetate mixture still can serve as a powerful cleaner, nevertheless, and is a desirable product, even if TEA is an additive. Care should be taken to limit the shelf life after makeup to reduce the likelihood that the alcohol reaction will occur to a significant degree.

The dipropionate solvent of the present invention effectively removes residues (such as oils, greases, epoxy resins, organic adhesives, waxes, photoresist, inks, fingernail enamel, or non-polymeric paints or coatings, particularly evaporative drying finishes (like shellac, lacquer, or varnish) from solid substrates including wood, plastic, metal, or ceramics. While such a solvent having effective amounts of ethylene dipropionate and propylene carbonate is less aggressive against acrylics and other plastics than a comparable solvent having ethylene diacetate substituted for the dipropionate, this solvent mixture is still a powerful cleaner that has an increased stability in water. I prefer it, if the solvent will be semi-aqueous or diluted.

The preferred dipropionate solvent is essentially nonflammable and has a vapor pressure that is below the allowable maximum that governmental agencies have contemplated for or established (as a compliance standard). The nonhazardous nature of the solvent reduces or eliminates apprehension that users normally associate today with the use of the conventional solvents, like MEK and methylene chloride, that have recently been drawn into question. The preferred dipropionate solvent of the present invention has a pleasant odor similar to pineapple and is stable under industrial storage conditions. Further, the increasing costs normally associated with the disposal of toxic or hazardous substances are circumvented or reduced because the debris-filled solvent of the present invention can be recovered or disposed of by less costly means that are required for hazardous wastes.

The solvent usually includes a nonionic wetting agent. A typical, preferred wetting agent has the formula:

$C_9H_{19}-\phi-(OCH_2CH_2)_{12}OH$ wherein $-\phi-$ is phenylene. Generally this wetting agent is added in volumes of about 5–10% to the carbonate/dipropionate mixture with or without the TEA or NMP additives.

When corrosion is not a significant factor to guard against, the dipropionate solvent can be diluted with water (as much as nine volumes of water to that of organic solvent; i.e., a final mix of 90% water by volume) and still be an effective cleaner, and I prefer this use. In this diluted condition, the solvent generally contains:
 ethylene carbonate, propylene carbonate, or a mixture of ethylene and propylene carbonate;
 ethylene dipropionate;
 optionally, TEA;
 optionally, NMP;
 the nonionic wetting agent; and
 water
One particularly effective solvent comprises about:
 about 40 vol % ethylene or propylene carbonate;
 about 40 vol % ethylene dipropionate;
 about 10 vol
  5 vol % TEA; and
  5 vol % NMP,
and, optionally, can be diluted with water to form a final mixture having about 75–90 vol % water.

DETAILED DESCRIPTION OF THE INVENTION

A particularly effective solvent that exhibits low toxicity and low volatility is provided by a mixture of an alicyclic carbonate and a polar compound having a strongly electronegative oxygen and selected from the group consisting of alkyl diethers, alkyl diesters, alkyl compounds containing both ester and ether groups, and mixtures thereof, particularly ethylene dipropionate.

Preferably the alicyclic carbonate is an equivolume mixture of ethylene carbonate and propylene carbonate or either component individually. Diesters are preferred for the polar compound over either diethers or ether/esters, and the preferred polar compound is ethylene dipropionate.

The dipropionate solvent of the present invention has low toxicity to promote its utility as a cleaner in handwipe situations and to reduce its overall cost. Hazardous or toxic wastes are a major environmental concern and require costly handling for safe disposal.

The preferred solvent has low volatility for both the safety of the workers and the environment.

A preferred mixture includes ethylene dipropionate and the alicyclic carbonate in all proportions, but preferably between about 50–60 vol % (and preferably 50–55 vol %) ethylene dipropionate, such a solvent provides a superior combination of properties.

The polar compounds which are useful in the present invention are generally of the type that include at least one (and generally two) strongly electronegative oxygen (generally a carbonyl) capable of complexing in solution with the alicyclic carbonate and of dissolving debris or residues during cleaning.

The polar compound preferably is selected from alkyl diesters, alkyl diethers, or alkyl compounds containing both an ester and an ether group, or mixtures thereof. Each polar compound of this type actually has at least two strongly electronegative oxygens. The most preferred polar compounds are the alkyl diesters and alkyl diethers which are symmetric or nearly symmetric. Examples of these symmetric polar compounds include ethylene diacetate, ethylene dipropionate, ethylene dibutyrate (i.e., alkylene dialkylates); ethylene glycol diethyl ether, ethylene glycol dimethyl ether (i.e., alkylene glycol dialkyl ethers); butyl diglycol carbonate; and dimethyl glutarate. Although asymmetric compounds may be used, the symmetric polar compounds are preferred because of their stronger electronegative oxygens compared to the electronegativity of the oxygens in the asymmetric compounds. Examples of asymmetric polar compounds include ethylene glycol monoacetate and ethyl-3-ethoxypropionate. Preferably, the polar compound is saturated so that the oxygens are free to rotate, thereby enabling them to complex readily with (through hydrogen bonding) or to dissolve both the alicyclic carbonate and the residue.

Ketones are also candidates for the polar solvent, although I prefer ethylene dipropionate for its overall properties. Mixtures of suitable polar compounds can be used as well.

The solvent of the present invention often includes a mixture of both ethylene carbonate and propylene carbonate and ethylene dipropionate to combine an exposed (carbonyl) oxygen on the alicyclic carbonates with the solvent properties of the dipropionate.

Throughout this specification, "residue" is used to refer to the material upon which the solvent acts to affect the desired cleaning "Residue" is often used interchangeably with "debris." "Dipropionate" alone normally means ethylene dipropionate. "Carbonate" alone normally means ethylene carbonate, propylene carbonate, or a mixture of both.

The preferred solvent of propylene carbonate and ethylene dipropionate has limited effectiveness for cleaning greases and oils, because, I believe, the solvent lacks any significant lipophilic elements. That is, the dipropionate and carbonate lack any saturated hydrocarbon segments of appreciable length or MW, and neither, accordingly, resemble oils. Therefore, for removal of greases and oils, without significant degrading of the important and advantageous toxicological and environmental properties of the solvent, triethanolamine (TEA) and N-methyl-2-pyrrolidone (NMP) in about 5–10 vol % proportions can be used together or separately with the carbonate/dipropionate mixture to remove greases. I have found TEA and NMP to be beneficial additives using as little as 5 vol % of either or both additives and the remainder an equivolume mixture of the carbonate/dipropionate mixture. TEA and/or NMP enhanced solvents have broad solvency with relatively low surface tension and outstanding aggressiveness for residues, including nonpolar species. I often use equal volumes of the two carbonates mixed with two volumes of dipropionate (i.e., 25:25:50 on a volumetric basis) as the base to which to add the TEA and/or NMP.

Other lipophilic additives can be added to the solvents to further enhance their cleaning power for greases. I have used ethylene dibutyrate, which cleans well, but has an odor. Ethylene dipropionate is a compromise having slightly lower MW than the dibutyrate without the odor problem. It also is immune to the TEA reaction that adversely affects the shelf life of an ethylene carbonate/ethylene diacetate mixture of my earlier inventions.

Moderate to high molecular weight alcohols or esters, especially the fatty acid esters (such as lanolin), the fatty acid alcohols (such as beeswax), or other $C_8$ through $C_{20}$ alkyl alcohols, ethylene dibutyrate or other higher ethylene dialkylates, or other additives that are lipophilic can be used to enhance the ability of the solvent to clean greases or oils.

Aggressiveness and cleaning power for removing or softening polymeric paints can be achieved by using the carbonate/dipropionate mixture in conjunction with a low molecular weight organic acid, such as formic or acetic acid, and, particularly, about 50 vol % glacial acetic acid. The introduction of an acid eliminates the aprotic character of the solvent, and limits industrial uses of the resulting mixtures to situations where corrosion is not a concern. For immersion or tank stripping of polymeric paints, such as epoxies, however, we have found the acetic acid/carbonate/dipropionate mixture to be effective when used at 150° F. for 10–15 minutes soak followed by scrapping or high pressure spray. Evaporative finishes (such as varnish, lacquer, or shellac) can be stripped without the addition of acid.

The electronegativity of the oxygen-containing groups of the dipropionate in combination with the electronegativity of the carbonate group in the alicyclic carbonate apparently enables the solvent of the present invention to exhibit its superior cleaning ability. Molecular interactions between the solvent and the residue involve varying degrees of van der Waals forces or hydrogen bonding. These interactions are generally stronger than the molecular interactions between molecules of the residue or between the residue and the substrate. We believe that this stronger molecular interaction and affinity between the solvent and residue enables the solvent to remove the residue.

One preferred solvent of the present invention, thus, includes between about 40 to 95 parts by volume ethylene dipropionate with the remainder propylene carbonate. The ratio of dipropionate and carbonate, within the range, will be varied primarily upon consideration of the particular cleaning task. If the material to be removed is more soluble in ethylene dipropionate that ethylene carbonate, then, the concentration of the dipropionate should predominate to the extent allowed within the range. The converse is similarly true. A preferred mixture includes between about 50 to about 60 parts by volume ethylene dipropionate with the remainder propylene carbonate.

The dipropionate solvent can also include other additives that are used to address specific cleaning problems. The selection of the particular additives and the amounts used should generally be consistent with the objective for the solvent. For example, relatively high MW, saturated alcohols (such as decanol), sulfonated amines, or ethyl-3-ethoxy-propionate may be added in small proportions as surfactants to decrease the surface tension of the solvent mixture. Further, propylene glycol or a related additive can be used to dilute the solvent to reduce its power or aggressiveness, for example, for acrylics.

A particularly preferred solvent with superior environmental, safety, and cleaning properties is about 5 vol % TEA, about 5 vol % of NMP, and the remainder essentially a equivolume mixture of propylene carbonate and ethylene dipropionate. This solvent is an excellent handwipe solvent that cleans a broad range of residues effectively, even nonpolar residues. While the ratio of TEA and NMP can be varied in such a solvent, I prefer to have equal volumes of TEA and NMP, because I believe I achieve the best cleaning properties. Because both TEA and NMP are relatively expensive, I attempt to minimize their use. Five vol % of each with the carbonate/dipropionate mixture has proven to be a superior solvent.

When using a multicomponent mixture (i.e., the alicyclic carbonate, the polar compound, and additives), I prefer to use essentially an equivolume mixture of the carbonate and dipropionate as a base. Of course, any mixture of carbonate to dipropionate within the identified range can be used.

The preferred solvents of the present invention generally have low vapor pressures, which means that, at ambient conditions in normal use, the user will not be exposed unnecessarily to large amounts of solvent vapor and the atmosphere will not be contaminated by the escaping hydrocarbons.

The solvent of the present invention has relatively high boiling temperature that allows the solvent to be used in heated baths or as a hot mixture without significant evaporation. One such use would be to remove photoresist by immersing boards into an agitated, heated bath of the solvent for several minutes.

The solvent can also include minor proportions of a nonionic wetting agent, particularly one of the formula:

$$C_9H_{19}-\phi-(OCH_2CH_2)_{12}OH,$$

wherein $-\phi-$ is phenylene. Generally this wetting agent is added in volumes of about 5–10% to the carbonate/dipropionate mixture with or without the TEA or NMP additives. An aliphatic wetting agent might also be used to avoid any questions of toxicity that an aromatic wetting agent, like that discussed above, presents.

When corrosion is not a significant factor to guard against, the solvent can be diluted with water (as much as nine volumes of water to that of organic solvent; i.e., a final mix of 90% water) and still be an effective cleaner. In this diluted condition, the preferred aqueous solvents contain:
  water;
  the alicyclic carbonate;
  ethylene dipropionate; and
  optionally, any or all of TEA,
    NMP, or
    a nonionic wetting
    agent
For example, such a solvent can comprise about:
  40 vol % propylene carbonate;
  40 vol % ethylene dipropionate;
  10 vol % nonionic wetting agent;
  5 vol % TEA; and
  5 vol % NMP,
and can be diluted with between about 3–9 volumes of water to leave a mixture that is about 75–9% vol % water.

In all these solvents, propylene carbonate can be replaced with 50:50 mixture of ethylene carbonate and propylene carbonate or be entirely replaced with ethylene carbonate.

Mixtures of ethylene carbonate and the dipropionate usually are made up by adding liquified ethylene carbonate to the dipropionate while stirring. Heating the mixture for a short time is recommended to ensure disassociation of the carbonate molecules and subsequent association with the diacetate.

The solvent can be applied with a cleaning rag or brush prior to scrubbing or it may be sprayed on. A part coated with residue can also be immersed in a bath of the solvent, as previously described, where ultrasound or other means are used to agitate the bath to speed the removal of the residue. Immersion cleaning is Particularly useful for removing photoresist. Vapor degreasing techniques can also be used by condensing the solvent on the substrate from a vapor, although vaporizing the solvent used and the contact time required in any cleaning technique depends on the nature of the residue and the specific composition of the mixture.

Solvents of the present invention can be used as general purpose solvents for polar and nonpolar residues, such as those generally encountered in the aerospace and electronics industries. In the cosmetic field the solvent is an effective fingernail enamel remover.

EXAMPLE 1

An equivolume mixture of ethylene dipropionate and propylene carbonate was tested against an MOK mixture of equal volumes of ethylene carbonate and ethylene diacetate and against an MOK II mixture of equal volumes ethylene carbonate and propylene carbonate mixed with two volumes (i.e., a volumetric ratio of 25:25:50) ethylene diacetate. The carbonate/dipropionate mixture exhibited similar cleaning power. The dipropionate solvent was slightly less aggressive against PVC and acrylic plastics and slightly more aggressive against grease or oil than its ethylene carbonate/ethylene diacetate counterpart.

EXAMPLE 2

The shelf life of a mixture of ethylene carbonate/ethylene diacetate/TEA was compared with the shelf life of a mixture of ethylene or propylene carbonate/ethylene dipropionate/TEA. The mixture with dipropionate had an extended shelf life.

Ethylene dipropionate can effectively be substituted for ethylene diacetate in any of the mixtures described in the examples of U.S. patent application 07/354,529 to produce a solvent of the present invention.

Additives such as acetic acid or water introduce replaceable hydrogens to the solvent, thereby altering its aprotic character. Accordingly, these additives are not preferred for universal applications, but are contemplated as desirable for specific cleaning problems where corrosion is less of a concern. I usually prefer to minimize the amount of these protic additives even when they are added to solve a particular cleaning problem. In many circumstances it is unimportant whether the solvent is aprotic. For those circumstances, nevertheless, where corrosion is an important concern, the dipropionate solvent is a powerful, low volatility, nonflammable cleaner with widespread applicability.

Various changes, substitutions, or alterations of the described embodiments might be made without departing from the broad, inventive concepts that are disclosed. The examples are provided to illustrate the invention and are not intended to limit it. The claims should be construed broadly in light of the description to include all described embodiments and their equivalents and should only be limited as required by the relevant prior art.

I claim:

1. A solvent having extended shelf life comprising a mixture of an one volume of ethylene carbonate, about the same volume of propylene carbonate, and about two volumes of ethylene dipropionate, further comprising about 5-10 vol % triethanolamine wherein the volume % triethanolamine is based on the combined volumes of the two carbonates and the dipropionate.

2. The solvent of claim 1 further comprising and effective amount of N-methyl-2-pyrrolidone.

3. The solvent claim 5 wherein the mixture is diluted with water.

4. The solvent of claim 5 further comprising an effective amount of nonionic wetting agent.

5. A method of cleaning debris from a substrate comprising the step of contacting the debris with the solvent of claim 5.

6. A solvent having enhanced shelf life, comprising:
an effective amount of an alicyclic carbonate selected from the group consisting of ethylene carbonate, propylene carbonate, or mixtures thereof;
substantially an equivolume of ethylene dipropionate;
5-10 vol % triethanolamine;
5-10 vol % N-methyl-2-pyrrolidone; and
5-10 vol % of a nonionic wetting agent,
wherein the volume % of the triethanolamine, N-methyl-2-pyrrolidone, and wetting agent are measured relative to the combined volume of the alicyclic carbonate and dipropionate.

7. The solvent of claim 6 further comprising an effective amount of water as a diluent.

8. A method for removing debris from a substrate comprising the step of contracting the debris with an effective amount of the solvent of claim 6.

9. The solvent of claim 1 wherein the carbonate is propylene carbonate.

* * * * *